US006596226B1

(12) United States Patent
Simard et al.

(10) Patent No.: US 6,596,226 B1
(45) Date of Patent: Jul. 22, 2003

(54) PROCESS FOR PRODUCING THERMOELECTRIC MATERIAL AND THERMOELECTRIC MATERIAL THEREOF

(75) Inventors: Jean-Pierre Simard, Montreal (CA); Dmitri Vasilevskiy, Montreal (CA); Jacques L'Ecuyer, Montreal (CA)

(73) Assignee: 5NPLUS Inc., Ville St-Laurent (CA)

( * ) Notice: Subject to any disclaimer, the term of this patent is extended or adjusted under 35 U.S.C. 154(b) by 0 days.

(21) Appl. No.: 09/644,689

(22) Filed: Aug. 24, 2000

(30) Foreign Application Priority Data

Aug. 27, 1999  (CA) .............................................. 2280990

(51) Int. Cl.$^7$ ................................................. B22F 3/20
(52) U.S. Cl. .......................... 419/32; 419/67; 136/238; 136/240; 136/201
(58) Field of Search ................................ 136/201, 238, 136/240; 419/67, 29, 32

(56) References Cited

U.S. PATENT DOCUMENTS

| | | | | |
|---|---|---|---|---|
| 4,588,520 A | * | 5/1986 | Jayadev et al. .............. 252/512 |
| 5,108,515 A | | 4/1992 | Ohta et al. | |
| 5,246,504 A | * | 9/1993 | Ohta et al. ................... 136/201 |
| 5,318,743 A | | 6/1994 | Tokiai et al. .................. 419/38 |
| 5,366,166 A | * | 11/1994 | Schilz et al. .................. 241/30 |
| 5,448,109 A | * | 9/1995 | Cauchy ....................... 257/719 |
| 5,726,381 A | | 3/1998 | Horio et al. | |
| 5,763,293 A | | 6/1998 | Yamashita et al. | |
| 5,981,863 A | * | 11/1999 | Yamashita et al. .......... 136/201 |
| 6,043,424 A | | 3/2000 | Horio et al. | |
| 6,147,293 A | * | 11/2000 | Tauchi et al. ............. 136/236.1 |

FOREIGN PATENT DOCUMENTS

| | | | |
|---|---|---|---|
| DE | 1 197 34 471 | | 2/1998 |
| EP | 0235702 A1 | * | 9/1987 |
| EP | 0369 340 | | 5/1990 |
| EP | 0476134 A1 | * | 3/1992 |
| EP | 0959507 A1 | * | 11/1999 |
| JP | 11 186620 | | 7/1999 |
| WO | 24735 | * | 9/1995 |

OTHER PUBLICATIONS

Jung, B. Y., et al; Thermolelectric Properties of P–type (Bi1–xSbx)2Te3 Fabricated by Mechanical Alloying Process, (1997) Materials Research Society Symposium Proceedings, 478 (Thermoelectric materials–New Directions and Approaches) 121–126.*

Kim, H, et al; Thermoelectric Properties of N–type Bi2(Te1–xSex)3 Fabricated by Mechanical Alloying and Hot Pressing, (1997) Materials Research Society Symposium Proceedings, 478 (Thermoelectric Materials–New Directions and Approaches) 151–156.*

Min, B.G. et al, Fabrication and Characterization of $Bi_2Te_3$–$Sb_2Te_3$ based Thermoelectric Materials by Powder–Extrusion–Sintering Technique, $16^{th}$ International Conference on Thermoelectrics (1997), pp. 76–80.

Benjamin, J. S., Dispersion Strengthened Superalloys by Mechanical Alloying, Metalurgic Transactions (1970), Vol.:1, pp. 2943–2951.

Schaffer, G.B. and P.G. McCormick, Mechanical Alloying, Material Forum (1992), Vol.:16, pp. 91–97.

Uemura, K.–I., CRC Handbook of Thermoelectrics, edited by D.M. Rowe, (1994) Chapter 49, Commerical Peltier modules, pp. 621–631.

Buist, R.J., CRC Handbook of Thermoelectrics, edited by D.M. Rowe, (1994) Chapter 18, Methodology for testing Thermoelectric Materials and Devices, pp. 189–209.

McNaughton, A.G., CRC Handbook of Thermoelectrics, edited by D.M. Rowe, (1994) Chapter 36, Commerically Available Generators, pp. 459–469.

Seo, J.H. et al., Effect of extrusion process on the thermoelectric Properties of Hot–Extruded N–type $Bi_2Te_{2.85}Se_{0.15}$ compounds, $16^{th}$ International Conference on Thermoelectrics, (1997), pp. 81–84.

* cited by examiner

*Primary Examiner*—Ngoclan Mai
(74) *Attorney, Agent, or Firm*—Ronald S. Kosie; Robert Brouillette; Gaetan Prince

(57) ABSTRACT

A process for producing a thermoelectric material based on two or more elements selected in the group constituted by Bi, Sb, Te and Se, which process comprises:

i. an alloying step wherein determined amounts of the elements Bi, Sb, Te or Se are mixed until an homogenous powdered alloy is obtained;

ii. an extrusion step of the powdered homogenous alloy obtained in the preceding step.

The elements Bi, Sb, Te or Se being preferably mechanically mixed in an homogenous powdered alloy.

The thermoelectric material, which are obtainable by this process, exhibits improved thermoelectric and mechanical properties and are therefore suitable, for example, as cooler, as temperature stabilizer in a electronic device or as power generator.

31 Claims, 5 Drawing Sheets

FIG_2

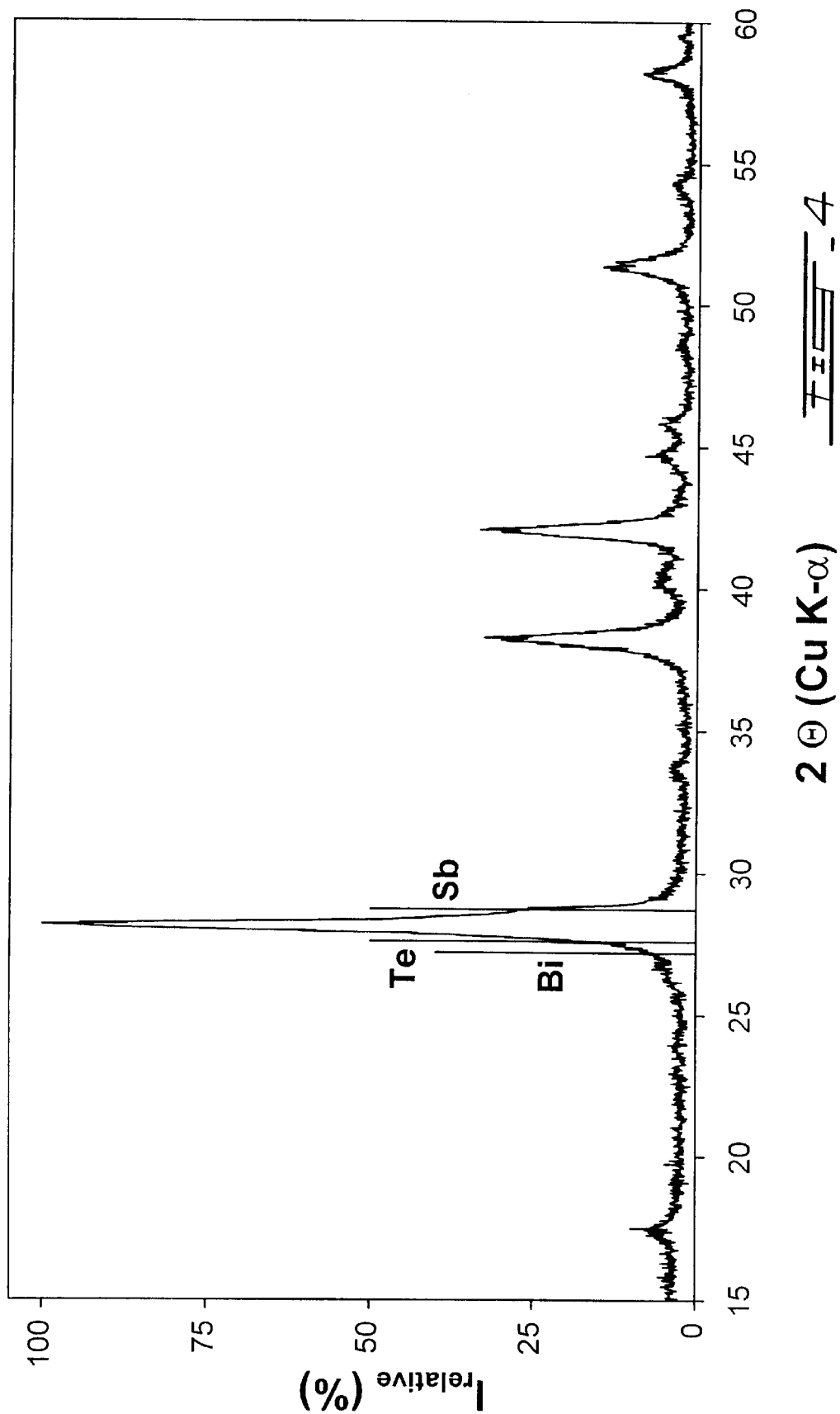

US 6,596,226 B1

PROCESS FOR PRODUCING THERMOELECTRIC MATERIAL AND THERMOELECTRIC MATERIAL THEREOF

BACKGROUND OF THE INVENTION

1. Field of the Invention

The present invention relates to a process for producing a thermoelectric material and to the thermoelectric material obtainable by said process.

More precisely, this invention is related to the fabrication of a thermoelectric material with outstanding properties, and to a manufacturing process thereof, which is superior to existing processes from an industrial standpoint.

The present invention further relates to the use of the thermoelectric material with outstanding properties obtainable by the process of the invention.

2. Description of the Prior Art

Thermoelectric materials based on the bismuth telluride, antimony telluride, bismuth selenide and antimony selenide family of alloys are currently widely used in a number of niche applications. These include cooling and temperature stabilization of electronic devices, as well as thermoelectric power generation. The working principle of devices made out of thermoelectric materials is related to the Peltier effect, and the closely related Seebeck effect. The thermoelectric device can either function as a heat pump when an electric current is allowed to flow (Peltier effect), or as a power source when a temperature gradient is imposed (Seebeck effect).

Investigated with significant resources in the early 60's, thermoelectric materials are again being examined with scrutiny for large-scale applications, being viewed as a replacement technology for the ozone-depleting compressor technology, and a potential source of electric power generated from the recovery of waste heat. The main hurdle to be overcome remains the cost to performance ratio, which is still too high. This is the result of the intrinsically poor performance of the available thermoelectric materials, which is accompanied by an extreme brittleness, which makes manufacturing tedious and thermoelectric device lifetime difficult to predict.

There have recently been a number of attempts to overcome this problem. For example, a series of powder processing methods have recently been described in U.S. Pat. No. 5,448,109, U.S. Pat. No. 5,108,515, U.S. Pat. No. 5,318,743 and in U.S. Pat. No. 5,246,504 in which the thermoelectric material is pulverized and then typically pressed and sintered. The mechanical properties are generally improved in these instances but the thermoelectric properties are not, or if so, only marginally. For example, in the method described in U.S. Pat. No. 5,448,109, only the p-type leg is pressed and sintered and the n-type leg is produced using conventional techniques, its performance being otherwise too severally degraded. In addition, these methods involve additional processing steps (over current manufacturing practices), such as crushing, often using a solvent, pressing into a green billet and in all cases a final sintering step, which limits the attainable part size. Such methods are therefore not considered of practical interest.

Methods aimed at improving the thermoelectric properties and also based on powder processing routes have also been described in U.S. Pat. No. 4,588,520, U.S. Pat. No. 5,726,381, U.S. Pat. No. 5,763,293, U.S. Pat. No. 5,981,863 and in U.S. Pat. No. 6,043,424. In some of these a second phase is promoted, whether this be through the direct incorporation of dopants, as described in U.S. Pat. No. 4,588,520 or in U.S. Pat. No. 5,726,381 or indirectly through a special quenching technique as described in U.S. Pat. No. 5,763,293 and in U.S. Pat. No. 5,981,863. Also reported in U.S. Pat. No. 6,043,424 is an improvement of thermoelectric properties through the control of the degree of oxidation of grain boundaries. In the method described in U.S. Pat. No. 4,588,520, the improvement is noticeable only at elevated temperatures and is therefore not of general interest. In the patents U.S. Pat. No. 5,726,381, U.S. Pat. No. 5,763,293, U.S. Pat. No. 5,981,863 and in U.S. Pat. No. 6,043,424, the improvements reported for the thermoelectric materials thereby obtained appear to be difficult to reproduce and these methods are thus considered problematic. They are also of limited practical interest because of their complexity involving, as those previously described, various crushing, pressing and sintering steps.

The method described in patent application DE-A-1 197 34 471 is of practical interest since enabling the fabrication of net shape alloy using a hot extrusion technique. There is therefore no need to perform a final sintering step and it appears that this technique can be applied to both a powdered material or an otherwise consolidated material (bulk ingot, green billet). An improvement in both the mechanical and thermoelectric properties is reported, but the method does not lead to the production of large pieces. In some other work i.e in Fabrication and Characterization of $Bi_2Te_3$—$Sb_2Te_3$ based Thermoelectric Materials by Powder-Extrusion-Sintering Technique, $16^{th}$ International Conference on Thermoelectrics (1997), p.76–80,by B-G. Min and al and in Effect of Extrusion process on the Thermoelectric Properties of Hot-Extruded N-type $Bi_2Te_{2.85}Se_{0.15}$, $16^{th}$ International Conference on Thermoelectrics (1997), p.81–84, extrusion of larger parts was attempted but macroscopic defects were then encountered to such an extent that the parts produced were of no practical interest.

Therefore, at this time, there is no method which would enable large parts exhibiting superior thermoelectric and mechanical properties to be produced. Furthermore, such large parts have never been reported. In addition, there is no known method, which would enable such large parts, if they could be obtained, to be produced using an efficient manufacturing process which could be scaleable leading to the large scale use of thermoelectric materials based on the bismuth telluride, antimony telluride, bismuth selenide and antimony selenide family of alloys.

SUMMARY OF THE INVENTION

More particularly, the present invention provides a process for producing a thermoelectric material based on two or more elements selected in the group constituted by Bi, Sb, Te and Se, which process comprises a mechanical alloying step wherein determined amounts of the elements Bi, Sb, Te or Se are mixed so as to obtain a powdered mechanical alloy. In accordance with the present invention, the powdered mechanical alloy may be a homogenous powdered mechanical alloy.

The present invention more specifically relates to a process for producing a thermoelectric material in the form of an extrudate by alloying, preferably by mechanically mixing determined amounts of the constituting elements of the thermoelectric material, which is preferably in a powdered form and by extruding the alloy thereby obtained with an extruder, which is preferably equipped with a multi-step die. The present invention further provides new extrudates of thermoelectric material based on two or more elements selected in the group constituted by Bi, Sb, Te and Se, which new extrudates being obtainable by the new process according to the invention. The extrudate thereby obtained, and in particular the high dimensional extrudates obtained by the process of the invention are useful in a suitable size and form, in devices with thermoelectric properties, particularly as cooler, as stabilizer of electronic devices, or as power generator.

More particularly, the different aspects of the invention may be summarized as follows.

In accordance with one aspect, the present invention relates to a process for producing a thermoelectric material based on two or more elements selected in the group constituted by Bi, Sb, Te and Se, which process may conprise:

i. a mechanical alloying step wherein determined amounts of the elements Bi, Sb, Te or Se are mixed so as to obtain a homogenous powdered mechanical alloy;

ii. an extrusion step, wherein said homogenous powdered mechanical alloy obtained in the preceding step is extruded.

In accordance with another aspect the present invention relates to a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a compaction step, wherein said homogenous powdered mechanical alloy obtained in the preceding step is compacted; and iii. an extrusion step, wherein the compacted alloy obtained in the preceding step is extruded.

In accordance with still another aspect, the present invention provides a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a compaction step, wherein said homogenous powdered mechanical alloy obtained in the preceding step is compacted;

iii. a heat treatment step, wherein the compacted alloy obtained in the preceding step is heat treated; and iv. an extrusion step, wherein the heat treated alloy obtained in the preceding step is extruded.

In accordance with a further aspect, the present invention provides a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a compaction step, wherein said homogenous powdered mechanical alloy obtained in the preceding step is compacted;

iii. a heat treatment step, wherein the compacted alloy obtained in the preceding step is heat treated;

iv. an extrusion step, wherein the heat treated alloy obtained in the preceding step is extruded; and v. an annealing step wherein the extrudate obtained in the preceding step is heated.

In accordance with yet a further aspect, the present invention relates to a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. an extrusion step, wherein said homogenous powdered mechanical alloy obtained in the preceding step is extruded; and iii. an annealing step wherein the extrudate obtained in the preceding step is heated.

In accordance with an additional aspect, the present invention provides a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a heat treatment step, wherein said homogenous powdered mechanical alloy obtained in the preceding step is heat treated;

iii. an extrusion step, wherein the heat treated alloy obtained in the preceding step is extruded; and iv. an annealing step wherein the extrudate obtained in the preceding step is heated.

In accordance with yet another aspect, the present invention relates to a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a heat treatment step, wherein said homogenous powdered mechanical alloy obtained in the preceding step is heat treated;

iii. an extrusion step, wherein the heat treated alloy obtained in the preceding step is extruded.

In accordance with yet another aspect, the present invention relates to a process for producing thermoelectric materials based on two or more elements selected in the group constituted by Bi, Sb, Te and Se, which process may comprise:

i. a mechanical alloying step wherein determined amounts of the elements Bi, Sb, Te or Se are mixed so as to obtain a homogenous powdered mechanical alloy;

ii. a compaction step, wherein said homogenous powdered mechanical alloy obtained in the preceding step is compacted;

iii. an extrusion step, wherein the compacted alloy obtained in the preceding step is extruded;

iii. an annealing step wherein the alloy obtained in the preceding step is heated.

In accordance with an additional aspect, the present invention relates to a process for producing thermoelectric materials based on two or more elements selected in the group constituted by Bi, Sb, Te and Se, which process comprises:

i. a mechanical alloying step wherein determined amounts of the elements Bi, Sb, Te or Se are mixed so as to obtain a homogenous powdered mechanical alloy;

ii. a compaction step, wherein said homogenous powdered mechanical alloy obtained in the preceding step is compacted;

iii. an annealing step wherein the compacted alloy obtained in the preceding step is heated.

In accordance with a further aspect, the present invention provides a mechanical alloy based on two or more elements selected in the group constituted by Bi, Sb, Te and Se. In accordance with the present invention, the mechanical alloy may be obtainable by anyone of the processes according to the invention.

In accordance with yet a further aspect, the present invention provides the use of a mechanical alloy according to the invention, as cooler, as stabilizer in a electronic device and as power generator.

In accordance with yet an additional aspect the present invention provides a mechanical alloy based on two or more elements selected in the group constituted by Bi, Sb, Te and Se, said mechanical alloy having a figure of merit Z greater than $2.65 \times 10^{-3}$ $K^{-1}$ (for example, for type n) and greater than $2.9 \times 10^{-3}$ $K^{-1}$ (for example, for type p) and a compression strength of at least 900 kg/cm$^2$.

BRIEF DESCRIPTION OF THE DRAWINGS

FIG. 4: is an x-ray diffraction pattern of the powder following mechanical alloying.

DESCRIPTION OF THE INVENTION

Figure 1:
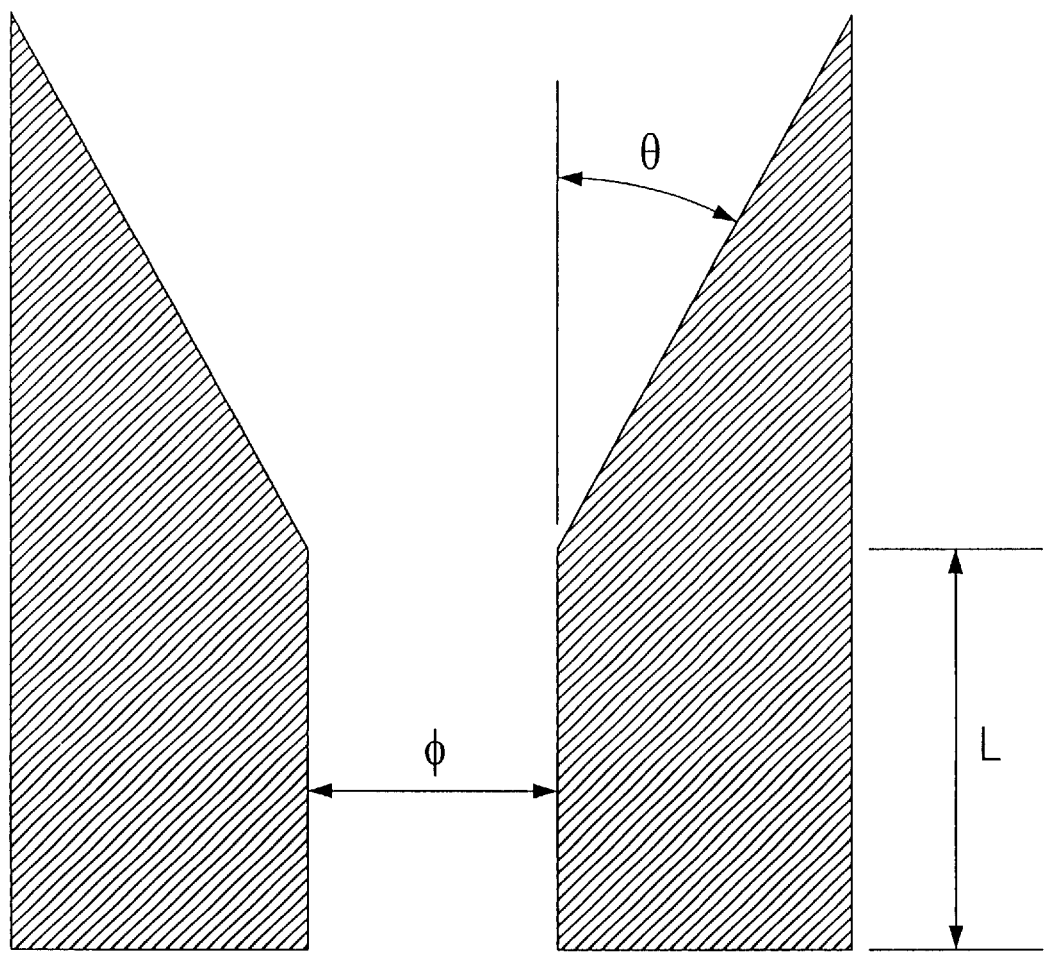
FIG. 1: is a cross sectional view showing an embodiment of a conventional die for extrusion as used in examples 1, 3 and in comparative example 3.

The steps of the processes according to the invention are described in a more detailed way as following.

i. Alloying Step

The starting materials used in this step are the constituting elements of the alloy in the desired proportions. They are preferably bismuth (Bi), tellurium (Te) and/or antimony (Sb) and/or selenium (Se), of the preferred desired thermoelectric alloys which are preferably p-type alloys of formula ($Bi_{2-x}Sb_xTe_3$) wherein x is comprised between 1.4 and 2 or of the n-type alloys of formula ($Bi_2Te_{3-y}Se_y$) wherein y is comprised between 0 and 0.6.

The minute amounts of at least one dopant may be added at this stage of the proceeding or at a later stage. The dopant(s) is (are) advantageously selected in the group comprising Bi, Sb, Te, Se, Pb, I, Cd, Cl, Cu and Ag.

The amount of dopant is usually comprised for the p-type alloys and for the n-type alloys between 0 and 0.8% weight.

The starting elements required for the alloy of formula ($Bi_{2-x}SbTe_3$) or of formula ($Bi_2Te_{3-y}Se_3$) include necessarily bismuth (Bi) and tellurium (Te) and may also include selenium (Se) and/or antimony (Sb) depending on the type of alloy being prepared (p-type or n-type).

The starting elements may be of commercial purity or of higher purity. They are preferably of a purity greater than 99.95, more preferably of a purity greater than 99.995. They may be in any available form, such as, for example shot or fragments.

Any alloying step may be carried out provided substantially no physical and/or no chemical degradation of the elements in the mixture occurs. Mechanical alloying is suited for such aims, however others alloying methods may also be used. The appropriate amounts of starting materials (Bi, Te and/or Sb and/or Se) are loaded in appropriate mixing means, optionally with the dopants. The appropriate mixing means are preferably a ball mill using a system or procedure preferably designed to prevent atmospheric exposure. It is however possible to use various types of ball mills. The starting materials, which may be initially present as fragment or shots, are gradually mixed and crushed into a fine powder. During the same period, the alloying reaction also takes place. If allowed to proceed for a sufficiently long period, the ball milling operation eventually leads to the complete alloying of the starting materials, in which there is no evidence for unreacted material as illustrated in the x-ray diffractogram of FIG. 4. These then present themselves as an alloy powder, preferably as a finely textured alloy powder. At this stage, the dopants when present, have been totally incorporated in solid solution in the alloy.

The load ratio, that is the ratio between the starting material load and the ball load, must be carefully optimized to minimize contamination of the alloy. This ratio is usually comprised between 0.4 and 0.05.

The ball used is preferably spheric with a diameter, preferably ranging from 1 to 15 mm. The ball is preferably made of a ceramic or of an alloy selected in the group constituted by stealite, mullite, silicon carbide, silicon nitride, sialon, alumina, zirconium silicate, zirconium oxyde, stainless steel, carbon steel, chrome steel and tungsten carbide.

The milling time is preferably comprised between 3 and 100 hours.

The mechanical alloying hereby obtained is considered finished and therefore the powdered alloy as homogenous when, on the x-ray diffraction pattern, the 100% peak of each pure element is less than 10% of the 100% peak of the alloy.

ii. Compaction (Optional)

The mechanically alloyed powders obtained in the above described step can be pressed, preferably cold pressed, advantageously under an inert atmosphere to obtain for example green billets. The compaction step can be carried out using usual uniaxial, biaxial or isostatic pressing. As a matter of example, it has been found that green billets produced by uniaxial pressing have an average density greater than 65%, preferably greater than 70% as measured using the ASTM method number B311, regardless of the alloy composition. The load of the compacter is usually comprised between 30 and 300 MPa increasing the load of the compacter (for example above 300 MPa) during uniaxial pressing does not lead to a further increase in density.

The compaction step is preferably carried out under a non oxydizing atmosphere.

iii. Heat Treatment (Optional)

Prior to the extrusion treatment, the compacted mixture (i.e the green billets) obtained in the compaction step can be annealed to reduce the stored energy resulting from the mechanical alloying step.

During this heat treatment, the alloy resulting from the preceding step(s) preferably in the form of an homogenous powdered alloy resulting from (step i), in a compacted form resulting from (step i and step ii), may be heated until a substantial reduction of the stored energy occurs.

The heating of the alloy is preferably carried out in a closed furnace for 3 to 40 hours, preferably under a non-oxidizing atmosphere.

iv. Extrusion

The extrusion treatment can be of the direct or indirect type. In both cases the alloy is loaded in the extrusion cylinder. The heating up cycle can be carried out either in a separate oven or directly in the extrusion cylinder. It is important however to avoid atmospheric exposure and thus if the pre-heating step is carried in a separate furnace, the furnace atmosphere must be controlled and some means devised to transfer the heated material to the extrusion chamber without atmospheric exposure.

Homogenous alloys obtained according to step i, whether or not having been compacted or whether or not having been heat treated, are preferably extruded at elevated temperatures. According to a preferred embodiment of the extrusion process, the extrusion step is carried out with alloys in the form of green billets obtained from homogenous alloys in the form of a powder, compacted and then heat treated.

The alloy powders, whether or not having been compacted previously into a green billet, are extruded at a temperature, preferably comprised between room temperature and 550° C., more preferably at elevated temperature, for example, at a temperature comprised between 320° C. and 490° C., for 0.5 to 8 hours, preferably for 1 to 4 hours.

The extrusion may comprise the three following steps:
1. An initial heating up cycle of the extruder to an extrusion temperature generally carried out without applying a load and preferably at a temperature ranging from room temperature to 550° C., preferably ranging from 320° C. to 490° C., for 0.5 to 8 hours, preferably for 1 to 4 hours;
2. A consolidation step in which a load, preferably comprised between 300 and 6000 kg/cm$^2$, is imposed at the extrusion temperature to promote consolidation. The load is generally selected in order to promote consolidation and uniform contact of the material with the interior of the extrusion cylinder, but avoid significant material flow through the die, although this is not mandatory and some material flow can be tolerated;
3. The extrusion per se under controlled speed (generally comprised between 0.1 mm/min and 8 mm/min) and load conditions, preferably comprised between 960 kg/cm$^2$ and 8500 kg/cm$^2$.

Extrusion, as the preceding and following steps of the process, is preferably carried out under a protective environment which is preferably a non-oxidizing atmosphere, for example an inert gas or a reducing gas or a mixture thereof, preferably a gas selected in the group constituted by argon, nitrogen, and mixtures thereof to prevent atmospheric exposure and in particular oxidation.

During the actual extrusion process, the material flow can be controlled either by specifying a displacement speed of the press or by imposing a load to the material being extruded. Both types of control are acceptable. However, according to a preferred embodiment of the invention, the extruded bar is allowed to cool down to below 200° C., preferably below 150° C., under a protective environment to prevent atmospheric contamination.

Figure 2:
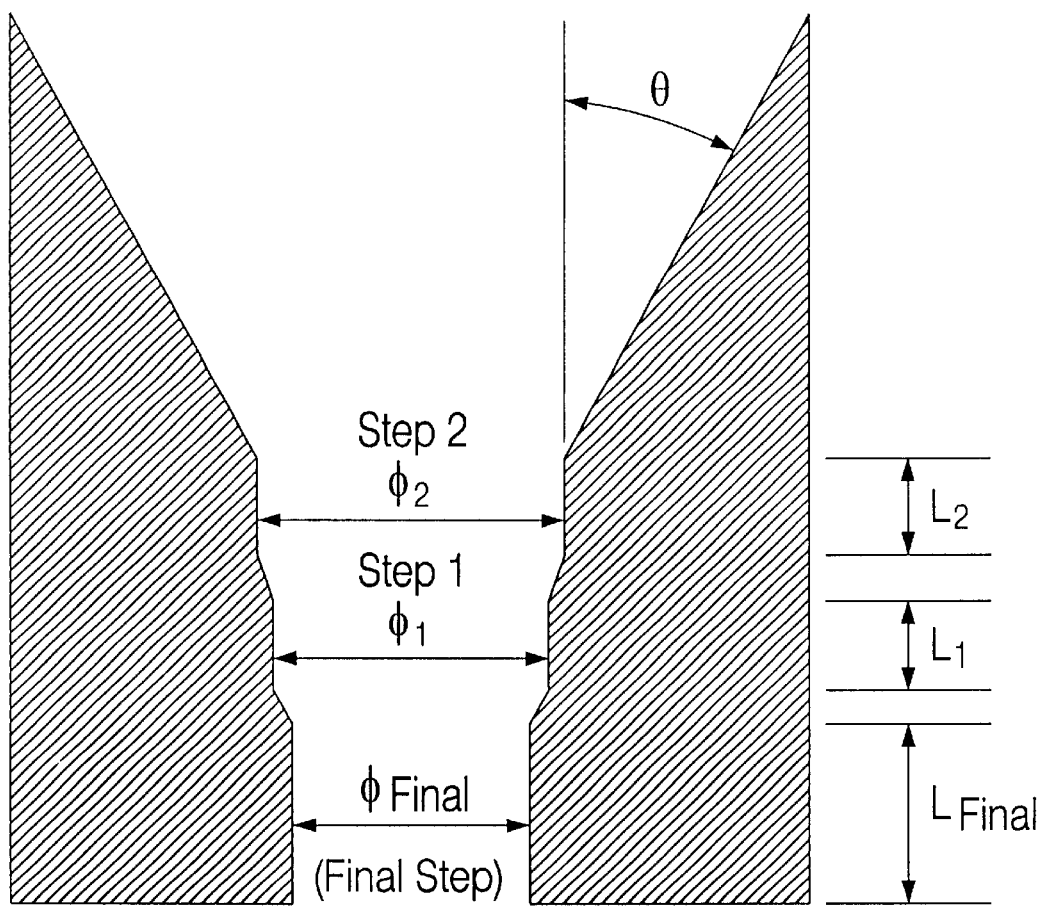
FIG. 2: is a cross sectional view showing an embodiment of a two-step die for extrusion as used in examples 2, 4, 5 and in comparative example 4.

The extrusion dies used in the process according to the invention are preferably multi-step dies. Compared to a conventional die, which is illustrated in FIG. 1, a multi-step die has several additional steps, for example, two as shown in FIG. 2 illustrating a two-step die.

The multi-step dies may preferably have at least one of the following three features:

the steps of the die are characterized by the relation:

$$1.01 \leq \frac{\phi_{i+1}}{\phi_i} \leq 1.20$$

wherein φ i represents the diameter of the step i and wherein φi+1 represents the diameter of the step i+1 of the die;

the entry angle (θ) as defined in FIG. 2, represents the angle between the extrusion direction and the internal wall of the extrusion cylinder and ranges from 10° to 60°; and the straight section between the two intermediate steps must comply with the relation:

$$0.01 \leq \frac{L_{i+1}}{\phi_{final}} \leq 1,$$

wherein φ final represents the final diameter of the extrudate and wherein Li represents the length of the step i.

During the extrusion treatment both sintering/consolidation and plastic flow of the powders occur. This leads to a drastic increase in density of up to 94% and preferably of up to 98%, as a result of intense compression forces and atomic diffusion, which are thermally activated, and also contributes to an improvement in the material properties.

v. Post-extrusion Heat Treatment (Optional)

The final part can be annealed to remove some of the residual stress by the extrusion operation. This generally has a beneficial effect leading to an improvement in the thermoelectric properties.

According to a further preferred embodiment of the invention, the process is essentially carried out under a non-oxidizing atmosphere, which is preferably an inert or a reducing gas or mixture thereof. According to a preferred embodiment of the invention, argon and/or hydrogen are used.

Thus, the extrudate obtained in the extrusion step is heat treated in a furnace under non oxidizing atmosphere for preferably 1 to 75 hours at a temperature preferably comprised between 300 and 550° C.

Therefore, the present invention provides a process for manufacturing a thermoelectric material in the desired sizes, such process being superior to existing processes from an industrial standpoint and compatible with the large scale use of thermoelectric materials.

Figures 5A, 5B, 5C, 5D, 5E, 5F:
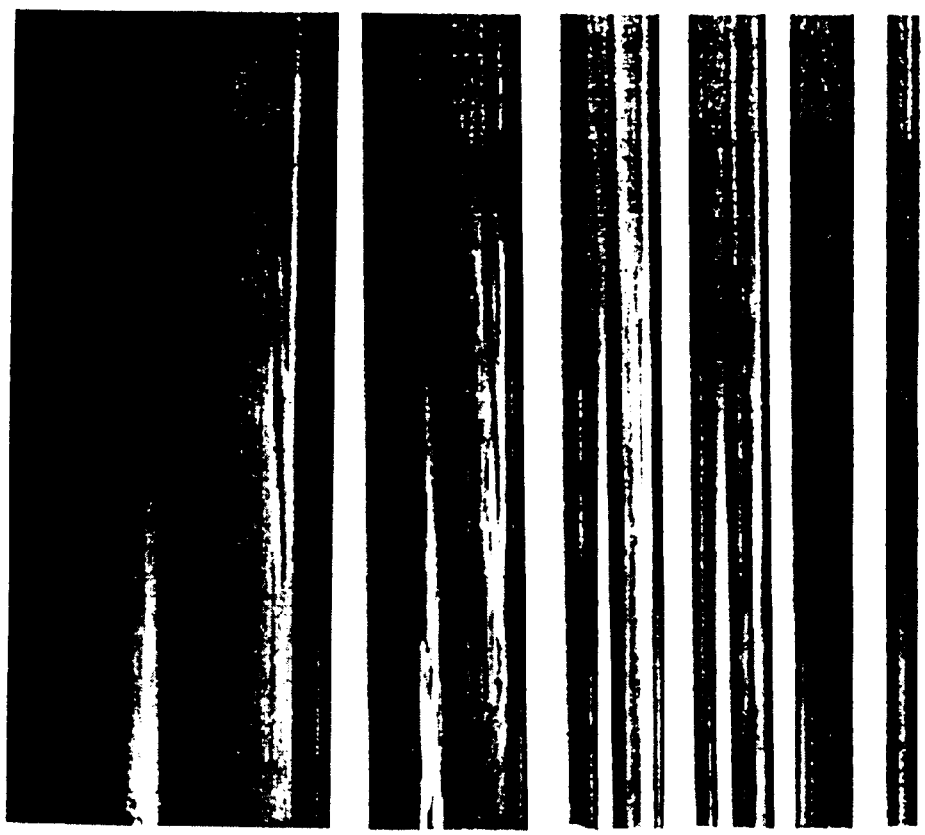
FIG. 5: is a photograph showing various parts produced using the process described herein.

This is further illustrated in FIG. 5 in which are shown various parts, which can be fabricated using the process described herein. The large parts, those of type-A, can be processed using conventional techniques, which involve cutting the ingot into slices perpendicular to the extrusion direction and then dicing the slice into its final size. Because the ingots produced using the process invented are much stronger mechanically, the cutting and dicing yields will be higher; leading to an overall improvement in the manufacturing yield. A further improvement over conventional techniques can be obtained by extruding to size, which implies that the ingot cross-sectional area is equal to that of the leg required (type E and F). In such instances, there is no need for dicing and the final leg can simply be obtained by cutting the ingot in a direction perpendicular to the extrusion axis. A significant portion of the so-called kerf losses (losses resulting for the cutting and dicing operations) is thus eliminated, leading to an improvement in the material yield and a corresponding decrease in manufacturing costs.

Among the extrudates according to the invention, those having a large section perpendicular to the extrusion direction, i.e. a section of at least 2 cm², are of particular interest.

Further extrudates of a thermoelectric material according to the invention which are also of a particular interest are those which are substantially free of structural defects For example, those which, at first sight, have an external surface free of defects and/or those having at a microscopic level, substantially no structural defects.

Those which are substantially free of internal microscopic defects present improved thermoelectric and mechanical properties.

Another prefered family of extrudates obtainable by the process of the invention are those which are selected in the group constituted by the p-type $(Bi_{2-x}Sb_xTe_3)$ alloys wherein x is comprised between 1.4 and 2 and by the n-type $(Bi_2Te_{3-y}Se_y)$ alloys wherein y is comprised between 0 and 0.6.

Extrudates according to the invention are those exhibiting, at a temperature of 300° K., a figure of merit Z greater than $2.2 \times 10^{-3}$ K$^{-1}$ (preferably greater than 2.9) for the p-type alloys and a figure of merit Z greater than $2 \times 10^{-3}$ K$^{-1}$ (preferably greater than 2.65) for the n-type alloys.

The figure of merit (Z) which is representative of the thermoelectric properties of the material is defined in the conventional way:

$$Z = \frac{s\sigma}{K}$$

where:
Z is expressed in units $\times 10^3$
S is the Seebeck coefficient in $\mu V/°$ C.
K is the thermal conductivity in mW/cm-° K.
$\sigma$ is the electrical conductivity in $(\Omega\text{-cm})^{-1}$ For this invention, Z, S and $\sigma$ were all measured independently using the technique recommended in the CRC handbook of Thermoelectrics, edited by D. M. Rowe (1994), chapter 18, pages 189 à 209 and K was calculated.

A further preferred family of extrudates according to the invention is constituted by those extrudates having, according to the ASTM method E9-89A, a compression strength of at least 900 kg/cm²

A further object of the present invention is the use of an extrudate according to the invention as cooler, as stabilizer in an electronic device and as a power generator.

Such applications are illustrated:
   by page 463 in "CRC Handbook of Thermoelectrics", Edited by D. M. Rowe, 1994 (Chapter 36, Commercialy Available Generators, Alan G. McNaughton), which is incorporated herewith by reference; and
   in FIG. 1, and by page 622 in "CRC Handbook of Thermoelectrics, Edited by D. M. Rowe, 1994 (Chapter 49, Commercial Peltier Modules, Kin-ichi Uemura), which is also incorporated herewith by reference.

Figure 3:
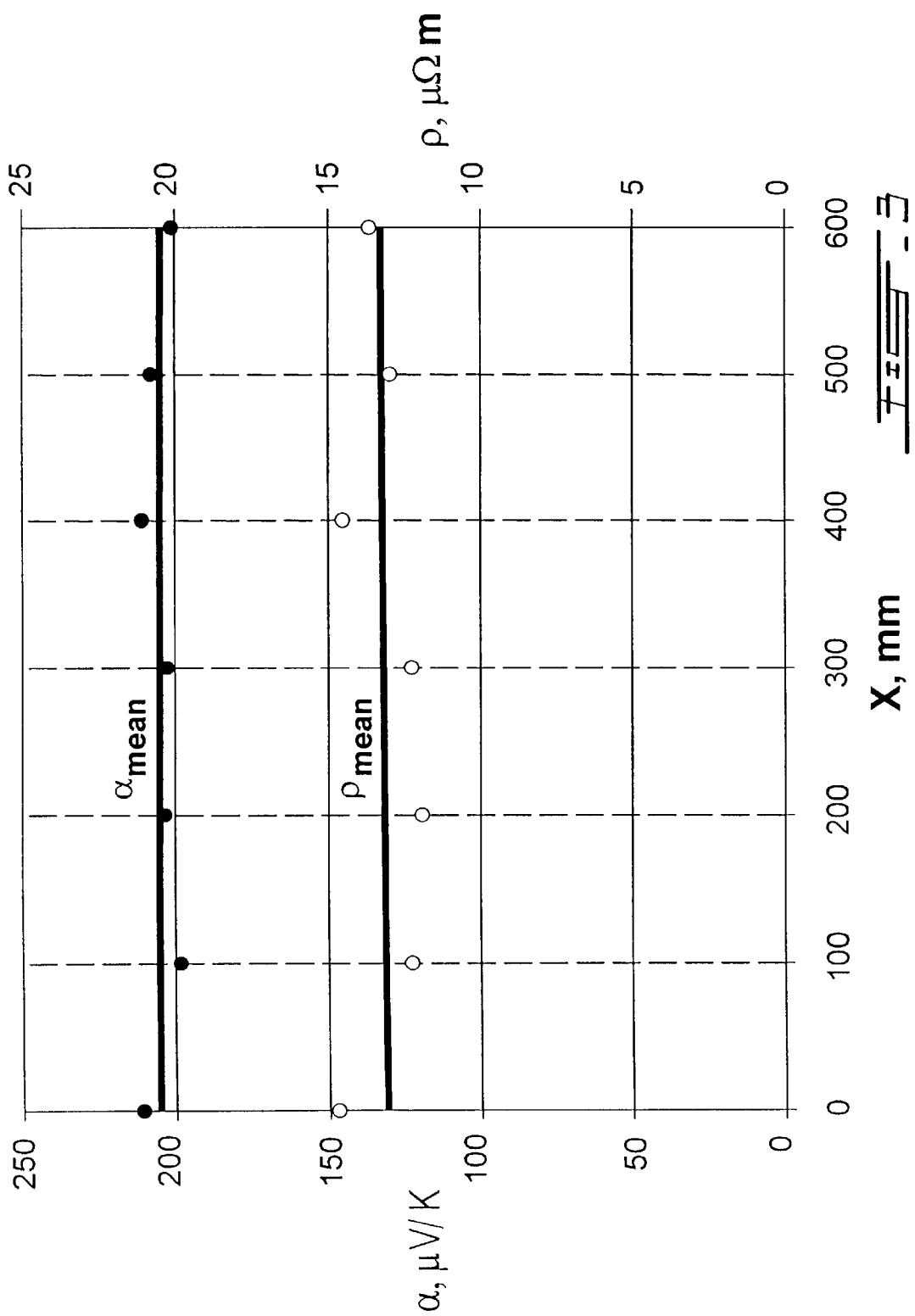
FIG. 3: is a graph illustrating the variation in electrical resistivity and Seebeck coefficient along the length of an extruded ingot.

The present invention provides a high quality thermoelectric material based on the bismuth telluride, antimony telluride, bismuth selenide and antimony selenide family of alloys, having superior mechanical and thermoelectric properties. In this respect, the mechanical properties were assessed by the compressive strength measured using the ASTM method E9-89A. These were found to lie systematically above 900 kg/cm². As for the thermoelectric parameters, these were found to be of high value as well as being relatively uniform throughout the ingots produced. This is shown in FIG. 3, where the variation in Seebeck coefficient and electrical resistivity is plotted along the ingot length. The Seebeck coefficient varies by less than 3% over a 600 mm length and the electrical resistivity by less than 9%. The variation of these parameters in the radial direction is even less supporting our conclusion that the uniformity in thermoelectric performance, as indicated by the figure of merit is good throughout the ingot. We have also found that the figure of merit is relatively insensitive to the shape and the cross-sectional area of the extruded components.

The present invention provides such material in a variety of sizes and especially in pieces of a large size and section suited for the desired application. This is further illustrated in FIG. 5 in which a variety of extruded sizes and shapes are shown.

Preferred extrudates obtained by the processes according tot he invention are those based on two or more elements selected in the group constituted by Bi, Sb, Te and Se, said extrudate having a figure of merit Z greater than $2.65 \times 10^{-3}$ K$^{-1}$ for type n and greater than $2.9 \times 10^{-3}$ K$^{-1}$ for type p and a compression strength of at least 900 kg/cm².

Those skilled in the art will gain further and better understanding of this invention and the new and important advantages, which is offered from the following illustrative, but not limiting, examples of this invention as it has been carried out.

EXAMPLE 1

For the first example, a mixture of a p-type thermoelectric alloy of the following composition: $Bi_{0.4}Sb_{1.6}Te_3$, doped with an excess of Sb (0.055% weight, was selected. This alloy was prepared by mechanically alloying 4.5 kg of a mixture of pure (99.999%) bismuth, antimony and tellurium, loaded in the appropriate proportions combined with the dopant, in an Attritor® type ball mill. The alloying conditions were as follows:

| Material Qty | | | |
| --- | --- | --- | --- |
| Bismuth | Antimony | Tellurium | Dopant (Sb) |
| 568.92 g | 1,325.79 g | 2,605.29 g | 2.48 g |
| Attritor Parameters | | | |
| Ball Size | Ball Qty | Rotation Speed | |
| 6.3 mm | 18.16 kg | 440 rpm | |

The resulting powder was unloaded from the ball mill in sealed containers to avoid atmospheric exposure (containers had previously been backfilled with argon), and then cold pressed to a density of 70% into 250 g billets, again under argon. These green billets were then transferred to the extrusion system and special precautions taken to minimize atmospheric exposure during transfer.

The extrusion conditions were as follows:

| Extrusion Ratio | Extruded Diameter (φ) | Extrusion Temperature |
|---|---|---|
| 6.25 | 25.4 mm | 440° C. | providing a bar of type A as shown in FIG. 5.

Prior to the initial heating up cycle, the extrusion chamber was argon purged with an amount of gas representing at least 8 times its total volume. The ramp up time to the extrusion temperature was of 150 minutes. A static load of 1275 kg/cm$^2$ was then applied for a period of 2 hours. The load gradually decayed over this period of time as the material in the extrusion chamber consolidated. Extrusion of the material per se took place immediately after the consolidation treatment using a load of 1900 kg/cm$^2$. Upon completion, the load was withdrawn and the extruded bar allowed to cool down to a temperature of less than 100° C. before being exposed to atmosphere. The die used for this extrusion was smooth and step free as shown in FIG. 1. As reported in following Table 1, the resulting extruded bar was cracked to such an extent that it was not possible to measure any of its thermoelectric properties.

EXAMPLE 2

A p-type thermoelectric alloy of the same composition as that in Example 1 ($Bi_{0.4}Sb_{1.6}Te_3$, doped with an excess of Sb (0.055% weight)), was prepared and extruded in the same way as in Example 1, except that the extruder was equipped with a two step die as represented in FIG. 2. This die was characterized by 2 steps in its straight section which led to a crack-free extruded bar. The thermoelectric properties of this bar are reported in Table 1.

COMPARATIVE EXAMPLE 2

In this comparative example, the same alloy and procedures as in example 2 were used, except that no special precautions to avoid atmospheric exposure during the transfer of the green billets to the extrusions equipment were taken. This resulted in an atmospheric exposure of the green billets of approximately 15 minutes. As shown in following Table 1, the thermoelectric properties of the extruded bar thereby obtained were significantly reduced when compared with the thermoelectric properties of the extruded bar obtained in previous Example 2.

EXAMPLE 3

A n-type thermoelectric alloy of the composition: $Bi_2Te_{2.625}Se_{0.375}$, doped with $SbI_3$ (0.03% weight) was prepared by mechanically alloying a mixture of 1.8 kg of pure (99.999%) bismuth, tellurium and selenium, loaded in the appropriate proportions combined with the dopant, in an Attritor® type ball mill. The alloying conditions were as follows:

| Material Qty | | | |
|---|---|---|---|
| Bismuth | Tellurium | Selenium | Dopant (Sb) |
| 961.42 g | 770.47 g | 68.11 g | 0.54 g |

| Attritor Parameters | | |
|---|---|---|
| Ball Size | Ball Qty | Rotation Speed |
| 6.3 mm | 18.16 kg | 440 rpm |

The resulting powder was unloaded from the ball mill in sealed containers to avoid atmospheric exposure (these had previously been backfilled with argon), cold pressed to a density of 70% into 250 g billets, again under argon, and then annealed under argon at 200° C. for a period of 16 hours. These green billets were then transferred to the extrusion system and special precautions taken to minimize atmospheric exposure during transfer.

The extrusion conditions were as follows:

| Extrusion Ratio | Extruded Diameter (φ) | Extrusion Temperature |
|---|---|---|
| 6.25 | 25.4 mm | 440° C. | providing a bar of type A as shown on FIG. 5.

Prior to the initial heating up cycle, the extrusion chamber was argon purged with an amount of gas representing at least 8 times its total volume. The ramp up time to the extrusion temperature was of 150 minutes. A static load of 1275 kg/cm$^2$ was then applied for a period of 2 hours. The load gradually decayed over this period of time as the material in the extrusion chamber consolidated. Extrusion of the material per se took place immediately after the consolidation treatment using a load of 1900 kg/cm$^2$. Upon completion, the load was withdrawn and the extruded bar allowed to cool down to a temperature of less than 100° C. before being exposed to atmosphere. The die used for this extrusion was smooth and step free as shown in FIG. 1. As reported in Table 1, the resulting extruded bar was cracked to such an extent that it was not possible to measure any of its thermoelectric properties.

EXAMPLE 4

A n-type thermoelectric alloy of the same composition as that in Example 3 ($Bi_2Te_{2.625}Se_{0.375}$, doped with $SbI_3$ (0.03% weight)), was prepared and extruded in a similar way as described in Example 3, except that the configuration of the extrusion die used in this example was the one shown in FIG. 2 (i.e. the die was characterized by 2 steps in its straight section). This led to a crack-free extruded bar exhibiting the thermoelectric properties reported in Table 1.

COMPARATIVE EXAMPLE 4

In this comparative example, the same alloy and procedures as in example 4 were used, except that no special precautions to avoid atmospheric exposure during the transfer of the green billets to the extrusion equipment, were taken. This resulted in an atmospheric exposure of the green billets of approximately 10 minutes. As shown in Table 1, the thermoelectric properties of the extruded bar thereby obtained are significantly reduced when compared with the thermoelectric properties of the extrudated bar obtained in Example 4.

EXAMPLE 5

An n-type thermoelectric alloy with the same composition as that in above Examples 3 and 4 ($Bi_2Te_{2.625}Se_{0.375}$, doped with $SbI_3$ (0.03% weight)), was prepared same way and extruded as in Example 4 using the two-step die shown in FIG. 2. The resulting extruded bar was then annealed under argon for a period of 10 hours at 420° C. The thermoelectric properties of this extruded and annealed bar are shown in Table 1.

EXAMPLE 6

For the sixth example, a p-type thermoelectric alloy of the following composition: $Bi_{0.4}Sb_{1.6}Te_3$, doped with an excess of Sb (0.055% weight) was selected. This alloy was prepared by mechanically alloying 1.816 kg of pure (99.999%) bismuth, antimony and telurium, loaded in the appropriate proportions combined with the dopant, in an Attritor® type ball mill. The alloying conditions were as follows:

| Material Qty | | | |
|---|---|---|---|
| Bismuth | Antimony | Tellurium | Dopant (Sb) |
| 258.29 g | 535.03 g | 1051.38 g | 1.00 g |

| Attritor Parameters | | |
|---|---|---|
| Ball Size | Ball Qty | Rotation Speed |
| 6.3 mm | 18.16 kg | 440 rpm |

The resulting powder was unloaded from the ball mill in sealed containers to avoid atmospheric exposure (these had previously been backfilled with argon), and then cold pressed to a density of 80% into 150 g billets, again under argon. These green billets were then transferred to the extrusion system and special precautions were taken to minimize atmospheric exposure during transfer.
The extrusion conditions were as follows:

| Extrusion Ratio | Extruded Diameter (φ) | Extrusion Temperature |
|---|---|---|
| 19 | 7.9 mm | 440° C. | providing a bar of type C as shown in FIG. 5.

Prior to the initial heating up cycle, the extrusion chamber, which includes both the cylinder and the die, was argon purged with an amount of gas representing at least 8 times its total volume. The ramp up time to the extrusion temperature was of 150 minutes. A static load of 4190 kg/cm² was then applied for a period of 2 hours. The load gradually decayed over this period of time as the material in the extrusion chamber consolidated. Extrusion of the material took place immediately after the consolidation treatment using a load of 6300 kg/cm². Upon completion, the load was withdrawn and the extruded bar allowed to cool down to a temperature of less than 100° C. before being exposed to atmosphere. The die used for this extrusion was smooth and step free as shown in FIG. 1.

EXAMPLE 7

For this example, we selected a p-type thermoelectric alloy of the same composition as that in Example 6 ($Bi_{0.4}Sb_{1.6}Te_3$, doped with an excess of Sb (0.055% weight)), which was prepared and extruded in exactly the same way. The exact configuration of the extrusion die used in this example was, however, different from that of example 6 by using a square section of 5 mm by 5 mm (type E bar shown in FIG. 5) and an extrusion ratio of 47. The thermoelectric properties of this bar are shown in table 1.

EXAMPLE 8

For this example, we selected a p-type thermoelectric alloy of the same composition as that in Example 6 ($Bi_{0.4}Sb_{1.6}Te_3$, doped with an excess of Sb (0.055% weight)), which was prepared and extruded in exactly the same way but we did not take any special precautions to avoid atmospheric exposure during the transfer of the green billets to the extrusions equipment. The exact configuration of the extrusion die used in this example was, however, different from that of example 6 by using a final diameter of 12.7 mm (type B bar shown in FIG. 5) and an extrusion ratio of 7.6. The thermoelectric properties of this bar are shown in table 1.

TABLE I

| | | | Thermoelectric properties | | | | | |
|---|---|---|---|---|---|---|---|---|
| | dopants (wt %) | atmosphere | ρ $\mu\Omega$ m | α $\mu V\ K^{-1}$ | λ W/mK | Z $10^{-3}\ K^{-1}$ | Compression strength kg/cm² | Crack |
| Example 1 | 0.055 (Sb) | Argon | Too severally cracked | | | | — | severe |
| Example 2 Comparative | 0.055 (Sb) | Argon | 97 | 219 | 165 | 299 | 1143 | — |
| Example 2 | 0.055 (Sb) | Argon | 84 | 186 | 167 | 246 | 1095 | — |
| Example 3 | 0.03 ($SbI_3$) | Argon | Too severally cracked | | | | — | severe |
| Example 4 Comparative | 0.03 ($SbI_3$) | Argon | 120 | −213 | 147 | 257 | 1230 | — |
| Example 4 | 0.03 ($SbI_3$) | Argon | 84 | −168 | 161 | 222 | 918 | — |
| Example 5 | 0.03 ($SbI_3$) | Argon | 117 | −216 | 147 | 271 | — | — |
| Example 6 | 0.055 (Sb) | Argon | 9.9 | 213 | 1.56 | 2.94 | — | — |
| Example 7 | 0.055 (Sb) | Argon | 9.6 | 215 | 1.60 | 3.00 | — | — |
| Example 8 | 0.055 (Sb) | Argon | 8.5 | 198 | 1.68 | 2.75 | — | — |

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention.

What is claimed is:

1. A mechanical alloy based on two or more elements selected in the group constituted by Bi, Sb, Te and Se, said mechanical alloy having a figure of merit Z greater than $2.65 \times 10^{-3}$ K$^{-1}$ for type n and greater than $2.9 \times 10^{-3}$ K$^{-1}$ for type p and a compression strength of at least 900 kg/cm$^2$.

2. A process for producing thermoelectric material based on two or more elements selected in the group constituted by Bi, Sb, Te and Se, which process comprises:
   i. mechanically alloying determined amounts of the elements Bi, Sb, Te or Se so as to obtain a homogenous powdered mechanical alloy;
   ii. compacting said homogenous powdered mechanical alloy obtained in the preceding step; and
   iii. extruding the compacted alloy obtained in the preceding step.

3. A process for producing thermoelectric materials based on two or more elements selected in the group constituted by Bi Sb, Te and Se, which process comprises:
   i. mecanically alloying determined amounts of the elements Bi, Sb, Te or Se so as to obtain a homogenous powdered mechanical alloy:
   ii. compacting said homogenous powdered mechanical alloy obtained in the preceding step;
   iii. heat treating the compacted alloy obtained in tie preceding step; and
   iv. extruding the heat treated alloy obtained in the preceding step.

4. A process for producing thermoelectric materials based on two or more elements selected in the group constituted by Bi, Sb, Te and Se, which process comprises:
   i. mechanically alloying determined amounts of the elements Bi, Sb, Te or Se so as to obtain a homogenous powdered mechanical alloy;
   ii. compacting said homogenous powdered mechanical alloy obtained in the preceding step;
   iii. heat treating the compacted alloy obtained in the preceding step;
   iv. extruding the heat treated alloy obtained in the preceding step; and
   v. annealing the extrudate obtained in the preceding step.

5. A process for producing thermoelectric materials based on two or more elements selected in the group constituted by Bi, Sb, Te and Se, which process comprises;
   i. mechanically alloying determined amounts of the elements Bi, Sb, Te or Se so as to obtain a homogenous powdered mechanical alloy;
   ii. heat treating said homogenous powdered mechanical alloy obtained in the preceding step,
   iii. extruding the heat treated alloy obtained in the preceding step; and
   iv. annealing the extrudate obtained in the preceding step.

6. A process for producing thermoelectric materials based on two or more elements selected in the group constituted by Bi, Sb, Te and Se, which process comprises:
   i mechanically alloying determined amounts of the elements Bi, Sb, Te or Se so as to obtain a homogenous powdered mechanical alloy,
   ii. heat treating said homogenous powdered mechanical alloy obtained in the preceding step;
   iii. extruding the heat treated alloy obtained in the preceding step.

7. A process according to claim 2, 3, 4, 5 or 6 wherein in step i, the elements Bi, Sb, Te or Se are mechanically mixed in a ball mill so as to obtain the homogenous powedered mechanical alloy.

8. A process according to claim 2, 3, 4, 5 or 6 wherein the extrusion step is carried out with a multi-step die.

9. A process according to claim 2, 3, 4, 5 or 6 wherein said process is essentially carried out under a non oxidizing atmosphere.

10. A mechanical alloy based on two or more elements selected in the group constituted by Bi, Sb, Te and Se, obtainable by anyone of the processes defined in claim 2, 3, 4, 5 or 6.

11. A process according to claim 2, 3, 4, 5 or 6 wherein, in step i, the elements Bi, Sb, Te or Se are mechanically mixed in a ball mill so as to obtain the homogenous powdered mechanical alloy; wherein the extrusion step is carried out with a multi-step die; and wherein said process is essentially carried out under a non oxidizing atmosphere.

12. A process according to claim 2, 3, 4, 5 or 6 wherein, in step i, the elements Bi, Sb, Te or Se are mechanically mixed in a ball mill so as to obtain the homogenous powdered mechanical alloy; wherein the extrusion step is carried out with a multi-step die; wherein said extrusion is carried out at elevated temperature; and wherein said process is essentially carried out under a non oxidizing atmosphere.

13. A process according to claim 2, 3, 4, 5 or 6 wherein, in step i, the elements Bi, Sb, Te or Se are mechanically mixed in a ball mill so as to obtain the homogenous powdered mechanical alloy; and wherein said process is essentially carried out under a non oxidizing atmosphere.

14. An extrudate of a mechanical alloy based on two or more elements selected in the group constituted by Bi, Sb, Te and Se, said extrudate having a cross section of at least 2 cm$^2$.

15. An extrudate of a mechanical alloy according to claim 14 which is substantially free of structural defects.

16. An extrudate of a mechanical alloy according to claim 15, selected in the group constituted by the p-type ($Bi_{2-x}Sb_xTe_3$) alloys wherein x is comprised between 1.4 and 2.0 and by the n-type ($Bi_2Te_{3-y}Se_y$) wherein y is comprised between 0 and 0.6.

17. An extrudate of a mechanical alloy according to claim 14, wherein said mechanical alloy has, at a temperature of 300° K., a figure of merit Z greater than $2.9 \times 10^{-3}$ K$^{-1}$ for the p-type alloys and a figure of merit Z greater than $2.65 \times 10^{-3}$ K$^{-1}$ for the n-type alloys.

18. An extrudate of a mechanical alloy according to claim 17, wherein said mechanical alloy has, according to the ASTM method E9-89A, a compression strength of at least 900 kg/cm$^2$.

19. A process for producing a thermoelectric material based on two or more elements selected in the group constituted by Bi, Sb, Te and Se, said process consisting of:
   i. mechanically alloying determined amounts of the elements Bi, Sb, Te or Se so as to obtain a homogenous powdered mechanical alloy and;
   ii. extruding said homogenous powdered mechanical alloy obtained in the preceding step.

20. A process according to claim 19 wherein said extrusion is carried out at elevated temperature.

21. A process according to claim 20, wherein said thermoelectric material is selected in the group constituted by the p-type ($Bi_{2-x}Sb_xTe3$) alloys wherein x is comprised between 1.4 and 2.0 and by the n-type ($Bi_2Te_{3-y}Se_y$) alloys wherein y is comprised between 0 and 0.6.

22. A process according to claim 19 wherein minute amounts of at least one dopant are incorporated during said process.

23. A process according to claim 22, wherein minute amounts of at least one dopant are incorporated in step i of said process.

24. A process according to claim 23, wherein the dopant(s) is (are) selected in the group constituted by Bi, Sb, Te, Se, Pb, I, Cd, Cl, Cu and Ag.

25. A process according to claim 19 wherein step i, the elements Bi, Sb, Te or Se are mechanically mixed in a ball mill so as to obtain the homogenous powedered mechanical alloy.

26. A process according to claim 19 wherein the extrusion step is carried out with a multi-step die.

27. A process according to claim 19 wherein said process is essentially carried out under a non oxidizing atmosphere.

28. A mechanical alloy based on two or more elements selected in the group constituted by Bi, Sb, Te and Se, obtainable by the process defined in claim 19.

29. A process according to claim 19 wherein, in step i, the elements Bi, Sb, Te or Se are mechanically mixed in a ball mill so as to obtain the homogenous powdered mechanical alloy; wherein the extrusion step is carried out with a multi-step die; and wherein said process is essentially carried out under a non oxidizing atmosphere.

30. A process according to claim 19 wherein, in step i, the elements Bi, Sb, Te or Se are mechanically mixed in a ball mill so as to obtain the homogenous powdered mechanical alloy; wherein the extrusion step is carried out with a multi-step die; wherein said extrusion is carried out at elevated temperature; and wherein said process is essentially carried out under a non oxidizing atmosphere.

31. A process according to claim 19 wherein, in step i, the elements Bi, Sb, Te or Se are mechanically mixed in a ball mill so as to obtain the homogenous powdered mechanical alloy; and wherein said process is essentially carried out under a non oxidizing atmosphere.

* * * * *